(12) United States Patent
Mahler et al.

(10) Patent No.: US 8,835,219 B2
(45) Date of Patent: Sep. 16, 2014

(54) DEVICE CONTACT, ELECTRIC DEVICE PACKAGE AND METHOD OF MANUFACTURING AN ELECTRIC DEVICE PACKAGE

(75) Inventors: Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 13/529,969

(22) Filed: Jun. 21, 2012

(65) Prior Publication Data

US 2013/0341778 A1    Dec. 26, 2013

(51) Int. Cl.
*H01L 23/34* (2006.01)
*H01L 23/48* (2006.01)

(52) U.S. Cl.
USPC ........... 438/106; 438/118; 438/613; 257/669; 257/675; 257/676; 257/712; 257/778; 257/E21.503; 257/E21.511; 257/E23.021; 257/E23.037

(58) Field of Classification Search
USPC .......... 438/106, 118, 613; 257/669, 675, 676, 257/712, 778, E21.503, E21.511, E23.021, 257/E23.037
See application file for complete search history.

(56) References Cited

U.S. PATENT DOCUMENTS

| | | | | |
|---|---|---|---|---|
| 7,052,935 B2* | 5/2006 | Pai et al. | .......... | 438/106 |
| 7,148,554 B2* | 12/2006 | Nah et al. | .......... | 257/532 |
| 7,982,307 B2* | 7/2011 | Amin et al. | .......... | 257/712 |
| 8,633,586 B2* | 1/2014 | Kim et al. | .......... | 257/737 |
| 2005/0104222 A1* | 5/2005 | Jeong et al. | .......... | 257/778 |
| 2009/0051016 A1 | 2/2009 | Galesic et al. | | |

OTHER PUBLICATIONS

Grosse, S., "Packaging with AuSn solder layers," downloaded on Jun. 21, 2012, 1-2 pages. http://translate.googleusercontent.com/translate_c?hl=en&rurl=translate.google.com&sl=de&tl=en&u=http://www.all-electronics.de/texte/anzeigen/42949/%3Fdrucken&usg=ALkJrhhbZtMsKBVTZijHkvAHQRknbctzYg.

* cited by examiner

*Primary Examiner* — Dao H Nguyen
(74) *Attorney, Agent, or Firm* — Slater & Matsil, L.L.P.

(57) ABSTRACT

An electric device and a method of making an electric device are disclosed. In one embodiment the electric device comprises a component comprising a component contact area and a carrier comprising a carrier contact area. The electric device further comprises a first conductive connection layer connecting the component contact area with the carrier contact area, wherein the first conductive connection layer overlies a first region of the component contact area and a second connection layer connecting the component contact area with the carrier contact area, wherein the second connection layer overlies a second region of the component contact area, and wherein the second connection layer comprises a polymer layer.

21 Claims, 5 Drawing Sheets a)

b)

US 8,835,219 B2

DEVICE CONTACT, ELECTRIC DEVICE PACKAGE AND METHOD OF MANUFACTURING AN ELECTRIC DEVICE PACKAGE

TECHNICAL FIELD

The present invention relates generally to a packaged electric device, and particularly to a packaged electric device comprising a buffer layer.

BACKGROUND

Packaging constitutes the last phase of single-chip or multiple chip device fabrication and provides the necessary interconnects between chip and chip carrier. Packaging further provides an enclosure protecting against environmental influences such as chemical corrosion and damage due to thermal and mechanical impact or irradiation.

Thermo-mechanical stress induced defects have become a reliability issue, impacting the lifetime of electronic devices. Delamination at the contact interface between chip and chip carrier and crack formation at or in the vicinity of the interface have been identified as contributor to the problem. A cause for the appearance of such defects is the application of high temperature or high pressure processes during device manufacturing, including assembly and packaging.

SUMMARY OF THE INVENTION

In accordance with an embodiment an electrical device comprises a component comprising a component contact area and a carrier comprising a carrier contact area. The electrical device further comprises a first conductive connection layer connecting the component contact area with the carrier contact area, wherein the first conductive connection layer overlies a first region of the component contact area and a second connection layer connecting the component contact area with the carrier contact area, wherein the second connection layer overlies a second region of the component contact area, and wherein the second connection layer comprises a polymer layer.

In accordance with an embodiment a device package comprises a semiconductor device comprising a drain contact at a bottom main surface, a leadframe with a leadframe contact area, a hybrid connection layer and an encapsulant encapsulating the semiconductor device. The hybrid connection layer connects the drain with the leadframe contact area, wherein the hybrid connection layer comprises a solder layer overlying more than about 70% of the bottom surface and a polymer connection layer disposed lateral adjacent to the solder layer and overlying less than about 30% of the bottom surface.

In accordance with an embodiment a method of manufacturing a packaged electrical device comprises forming a backside metallization (BSM) layer over the backside of a carrier, forming selectively a conductive connection layer over the BSM layer, the conductive connection layer being disposed at a center region of a component of a plurality of component of the carrier and singulating the component from the carrier. The method further comprises bonding the component to a component carrier and encapsulating the component and at least a portion of the component carrier.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely to a chip attachment to a leadframe. However, embodiments of the invention may be applied to any type of carrier or component.

Figure 1:
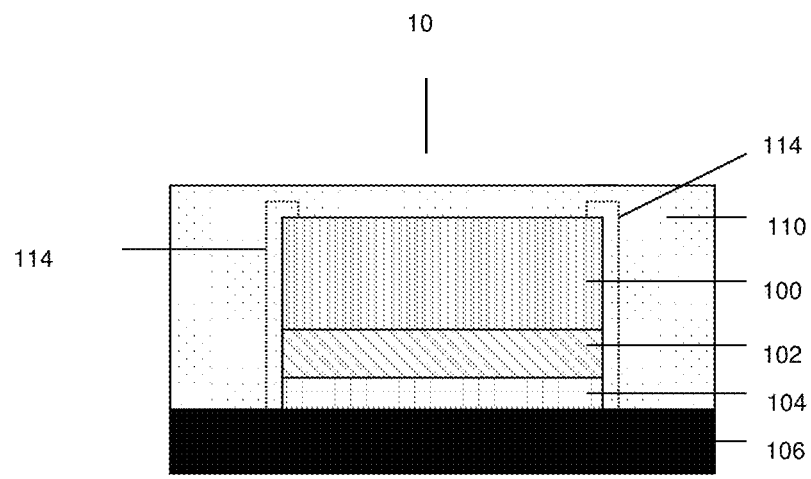
FIG. 1 illustrates a cross-sectional view of a conventional chip, wherein the conventional chip is attached to a chip carrier in a backside contact architecture.

FIG. 1 shows a semiconductor device 10 with backside chip architecture. The semiconductor device 10 comprises a chip 100 disposed on a copper (Cu) leadframe 106. The chip 100 is electrically connected to the Cu leadframe 106 through a backside metallization (BSM) layer 102 and a solder layer 104. A molding material 110 encapsulates the chip 100. The solder layer 104 may be soft and malleable during certain stages of the bonding process to establish a contact between the backside of the chip 100 and the top surface of the Cu leadframe 106. However after the completion of the bonding process the solder layer 104 is stiff and provides a solid mechanical connection.

A problem with such conventional chip backside architecture is that the regions along the lateral periphery of the chip ("edge regions") 114 are prone to delaminations, fractures, cracks and other types of damages.

An embodiment of the invention provides a contact between a component and a component carrier with a hybrid connection layer arrangement. A solder layer and a buffer layer may provide the electrical contact between the component and the component carrier in a backside attachment configuration. In one embodiment the solder layer may cover about 70% or more of the contact area and the buffer layer may cover about 30% or less of the contact area. The buffer layer may be elastic and/or comprise a proper coefficient of thermal expansion (CTE coefficient). The buffer layer may comprise a polymer. An advantage of such a hybrid connection layer arrangement is that the occurrence of cracks, fractures and delaminations is substantially reduced relative to a conventional arrangement and that therefore the component is more reliable.

A further embodiment of the invention provides a method of forming the hybrid connection layer arrangement on a backside of a wafer.

Figure 2:
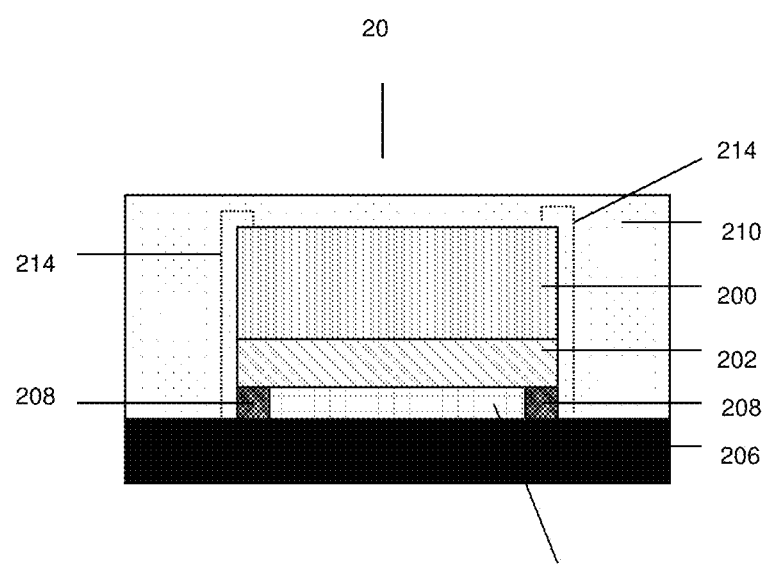
FIG. 2 illustrates a cross-sectional view of a first embodiment of a packed electric component in a backside contact architecture.

FIG. 2 shows an embodiment of a packaged electric device or a packaged semiconductor device 20. The packaged electric device 20 comprises a component 200 disposed on a carrier 206. The component 200 may be a semiconductor device such as a logic device, or a volatile or non-volatile memory device. The semiconductor device may be an integrated circuit (IC) or a single discrete device (stand-alone device). For example, the semiconductor device is an IGBT or a power MOSFET. Alternatively the component 200 is a passive device such as a resistor, a capacitor, a MEMS device, an optoelectronic component, or a device of other functionality. The substrate/base of the component 200 upon which or into which the electrical device is built may be a semiconductive material such as silicon or germanium, a compound semiconductor such as SiGe, GaAs, InP, GaN or SiC or may comprise other inorganic or organic materials such as glass, ceramics.

The component 200 has a first main surface or top surface and a second main surface or bottom surface. The area of the bottom surface may be the same as the area of the top surface. The component 200 has a contact at the bottom surface. The component 200 may further comprise one or more contacts on other surfaces. In a particular example, the component 200 has the drain contact on the bottom surface and the gate and source contact on the top surface.

The packaged electric device 20 further comprises a component carrier 206 upon which the component 200 is disposed. The component carrier 206 may comprise a substrate such as a semiconductive material, a ceramic, glass, or a mechanically stable organic compound. The component carrier 206 may comprise conductive and/or non-conductive elements. For example, the component carrier 206 may comprise a silicon substrate, a printed circuit board (PCB) or a leadframe. The PCB may be a laminated substrate such as a prepreg stack comprising alternate layers of conducting material and glass impregnated with epoxide resins. The metallic leadframe may comprise nickel (Ni), copper (Cu) or a combination thereof.

The component 200 is electrically connected to the component carrier 206 through a backside metallization (BSM) layer 202 and a hybrid connection layer comprising a first connection layer 204 and a second connection layer 208.

The backside metallization (BSM) layer 202 is disposed on a backside of the component 200. The BSM layer 202 may comprise a single layer or a plurality of layers comprising different materials. For example, the BSM layer 202 may be a tri-layer stack. In one embodiment the BSM layer 202 stack for a chip with vertical current flow may be Al/Ti/NiV, Al/Ti/NiV/Ag, Al/Ti/Ni/Ti, Al/Ti/Ni/Ti/Ag, Al/Ti/TiNi/Ni/Ti/Ag, Al/Ti/NiV/Ag, Al/Ti/NiV, Al/Ti, Al/Ti/Cu/Sn/Ag, Al/TiW or Al/TiW/Cu/Sn/Ag.

The first layer of the BSM layer 202 may be an ohmic contact to the substrate of the component 200. The ohmic contact layer may comprise a metal such as Al. The second layer of the BSM layer 202 may protect electrical circuits and interconnects against undesired bonding related metal diffusion from the contact interface into the component/substrate 200. Moreover, the second layer may improve the adhesion of the solder layer to the component/substrate 200. The second layer may comprise a metal such as Cr, Ti or Ta. The second layer may be about 200 nm to about 300 nm thick.

The third layer of the BSM layer 202 may be configured to exhibit a high coefficient of diffusion into the adjacent hybrid connection layer, providing a strong interface bonding. The last layer may comprise a metal such as gold (Au), silver (Ag), nickel (Ni), copper (Cu), or combinations of these materials. The last layer may be about 100 nm to about 10 μm thick, while the overall thickness of the BSM layer may be about 500 nm to about 15 um thick. In one embodiment the BSM layer is partially reacted with the metal layer of the carrier when the component 200 is attached to the carrier 206.

A first connection layer 204 is disposed between the BSM layer 202 and the component carrier 206. The first connection layer 204 may be disposed over a first region of the bottom surface of the component 200. The first connection layer 204 may comprise more than about 70% or more than about 90% of the area of the bottom main surface of the component 200. In one example, the first connection layer 204 may comprise between about 70% and about 90% of the area of bottom main surface of the component 200. The first connection layer 204 may overlay a central region of the bottom surface.

The first connection layer 204 may comprise an inorganic or organic material configured to provide a strong chemical bonding to the BSM layer 202 and the component carrier 206. The first connection layer 204 comprises a conductive material such as a metal or a metal alloy. In one embodiment the first connection layer 204 is a solder layer. For example, the solder layer may comprise binary or ternary alloys such as Pb/Sn, Au/Sn, Ag/Sn, Cu/Sn, Au, Si, Sn/Sb or Sn/Ag/Sb. The solder material may be Pb-free material. In one embodiment the solder material provides a low-resistance contact between the semiconductor die and the metallic leadframe.

A second connection layer (e.g., buffer layer) 208 is disposed between the BSM layer 202 and the component carrier 206. The second connection layer 208 is disposed adjacent to the first connection layer 208. The second connection layer 208 may be disposed in a second region of the bottom surface of the component 200. The second connection layer 208 may comprise less than about 10% or less than about 30% of the bottom surface area of the component 200. In one embodiment the second connection 208 layer may comprise between about 10% and about 30% of the bottom surface of the component 200. The second connection layer 208 may overlay a periphery region of the bottom surface of the component 200.

In one embodiment the second connection layer 208 is an elastic material such as a polymer. Elastic means that the second connection layer 208 is significantly more elastic than the first connection layer 204. The elastic coefficient value for the second connection material 208 may be significantly higher than the elastic coefficient of the first connection material 204. For example, 1 MPa to 50 GPa, e.g., 100 MPa to 10 GPa. Because the second connection layer 208 is elastic the layer is able to eliminate or alleviate the impact of stress forces occurring in the periphery of the contact between the component 200 and the component carrier 206 and the chip edge region 214. The second connection layer may be a polymer material connection layer.

In one embodiment the second connection layer 208 is optimized with respect to its coefficient of thermal expansion (CTE) to minimize thermo-mechanical stress in the component edge region 214. The second connection layer 208 may moderate the large difference in the CTE coefficients of the materials involved. For example, the materials with highest contributions are the component 200 material and the component carrier 206 material. For example, the CTE value for Si substrate is about 2.5 ppm/K and the CTE value for the Cu leadframe 16.5 ppm/K. In one embodiment the second connection layer 208 comprises a CTE value in the range of about 5 ppm/K to about 200 ppm/K, e.g., about 20 ppm/K to about 100 ppm/K, to provide stress relief for the resulting device after the contact is formed.

The second connection layer 208 may comprise organic nonconductive materials. For example, the second connection layer may comprise a polymer. The second connection layer 208 may be an elastic polymer insulation connection layer. In one embodiment the second connection layer 208 comprises polymers with short-term thermal stability of up to about 400° C. to withstand high solder temperatures. The second connection layer 208 material may comprise highly cross-linked epoxide or acrylate resins, polyimides, or high-performance thermoplastic materials such as polyphenylensulfides (PPS), polysulfones (PSU) or liquid crystalline polymers (LCP). The second connection layer may comprise non-conductive filler particles. The second connection layer 208 may provide good adhesion and good wetting characteristics.

In an embodiment, the second connection material 208 may be electrically conductive. For example, the conductive material may be a polymer of the same types as described above comprising a sufficiently high concentration of a conductive filler material. The conductive filler material may be small conductive particles (<5 μm) uniformly distributed within the polymer. These filler particles may comprise silver (Ag) or copper (Cu), for example. Alternatively, the filler particles may be carbon like graphene or carbon nanotubes (CNTs). Other conductive connection materials may comprise polymer or copolymer of the above mentioned base polymers with compounds exhibiting inherent conductivity such as polyaniline, polyacetylene or polythiopene. The second connection layer 208 may be an elastic conductive polymer connection layer. The second conductive connection layer 208 may not be a metal layer.

The first and second connection layer 204 and 208 form the hybrid connection layer. The hybrid connection layer may comprise a ratio of about 9/1 to about 7/3 between the first connection layer 204 and the second connection layer 208. The hybrid connection layer may not overlay the entire bottom surface of the component 200 but only a portion of the bottom surface of the component 200.

The packaged electrical device 20 further comprises an encapsulant 210. The encapsulation material of the encapsulant 210 may be a molding compound or a laminate. For example, the encapsulation material may comprise thermosetting materials such as an epoxy, polyurethane or polyacryliate compound. Alternatively the encapsulation material may comprise thermoplastic materials such as polysulfones, polyphenylen sulfides, or polyetherimides. In one example, the encapsulation 210 may comprise a polyimide such as a Si-modified polyimide.

Figure 3:
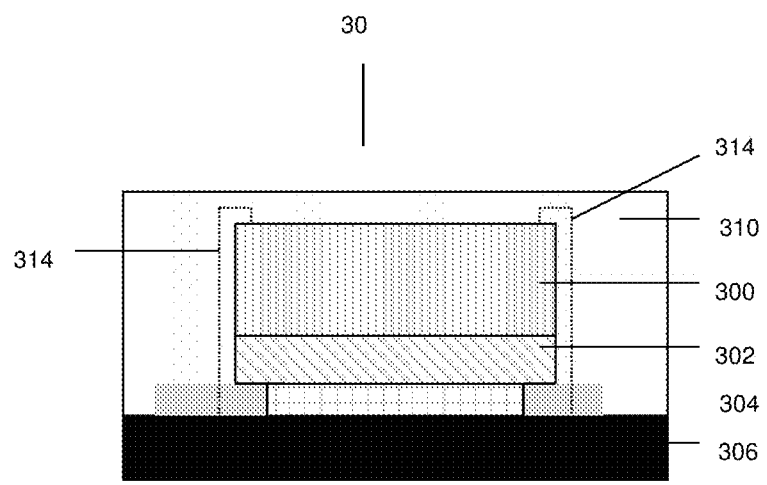
FIG. 3 illustrates a cross-sectional view of a second embodiment of a packed electric component in a backside contact architecture.

FIG. 3 shows another embodiment of a packaged electrical device 30. The packaged electrical device 30 comprises a component 300, a BSM layer 302, a first connection layer 304, a carrier 306 and an encapsulant 310. These elements comprise the same or similar materials as with respect to the embodiment of FIG. 2. However, the second connection layer comprises the encapsulation material of the encapsulant 310. The encapsulation material may comprise the proper elastic coefficient, CTE coefficient or combinations thereof. The encapsulation material may provide protection against mechanical or corrosive damage. An advantage of the embodiment of FIG. 3 is that it is very cost efficient because few processing steps are required to manufacture the packaged electrical device 30.

Figure 4:
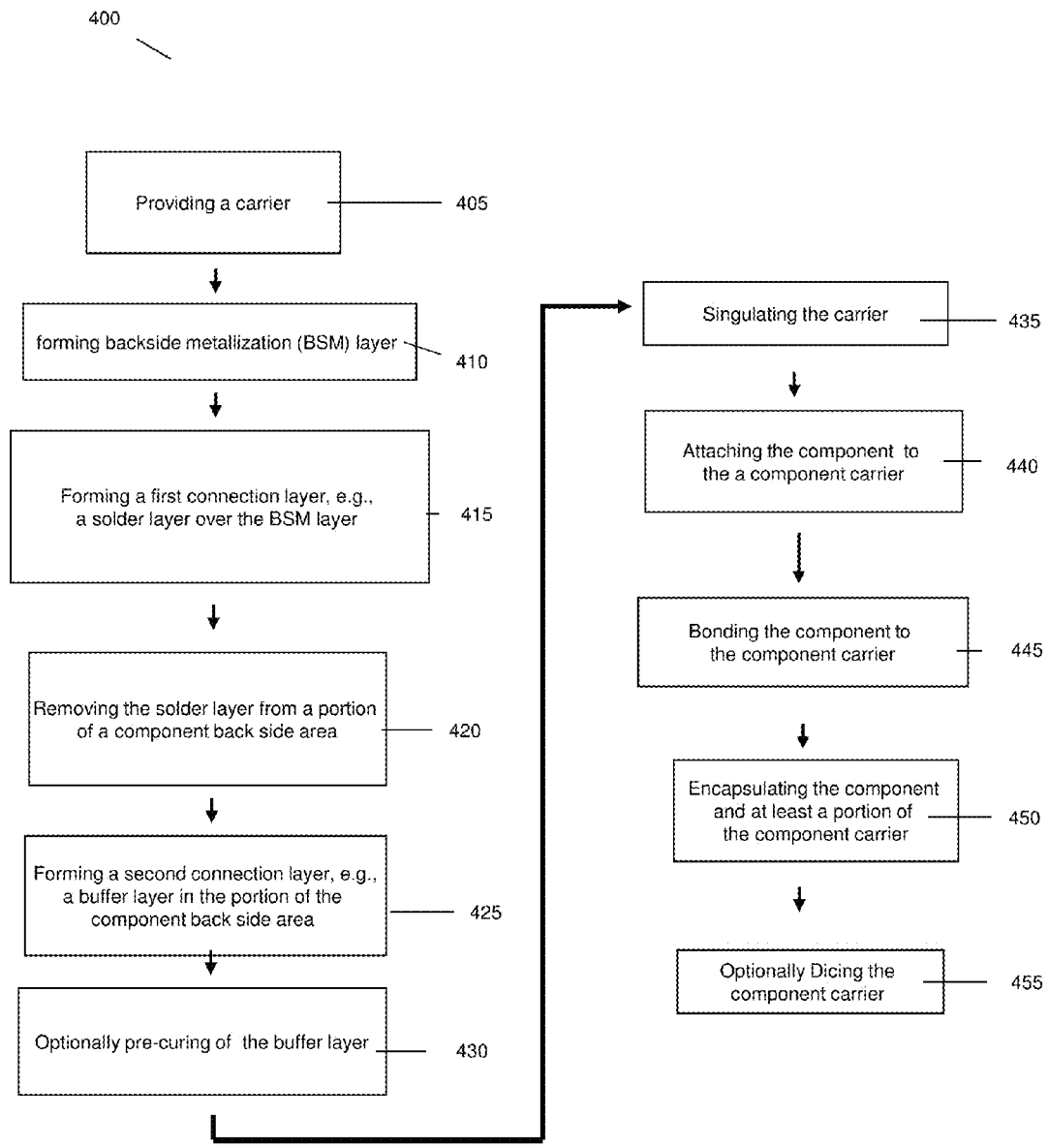
FIG. 4 shows an embodiment of a process flow for manufacturing a packaged electric component.

FIG. 4 shows an embodiment of a flow chart 400 to manufacture a packaged electric component. In a first step 405, a carrier is provided. The carrier may be a workpiece, a substrate, a wafer, or a printed circuit board (PCB). Alternatively, the carrier is a substrate with non-packaged chips or components placed thereon. In one embodiment the wafer may comprise a semiconductor material or a compound material and one or more interconnect metallization layers disposed thereon. A passivation layer is disposed over the interconnect metallization layers and the chip contact pads are disposed on or defined by the passivation layer.

In step 410 a backside metallization (BSM) layer is formed over the backside of the carrier. The backside of the carrier may be the side where a minority of elements is located relative to the top side of the carrier. The BSM layer may be a single layer or a plurality of layers. The BSM layer may be deposited by electro plating, chemical vapor deposition (CVD), ion beam sputtering or reactive sputtering, for example.

In a further step 415, a first connection layer or conductive connection layer (e.g., solder) is formed over the BSM layer. The first connection layer may be formed in a blanket deposition process. The material of the first connection layer, e.g., a solder material, may be deposited by electroplating, vapor deposition, evaporation sputtering, spraying, sprinkling or beading. Alternatively, the material may be printed or dispersed on the BSM layer, or deposited in form of solder paste.

At step 420, the first connection layer is patterned. The first connection layer is patterned such that the first connection layer remains over a first region (e.g., a central region) of a component of a plurality of components disposed in or on the carrier or the BSM layer. The first connection layer is removed over a second region (e.g., a peripheral region) of the component backside or the BSM layer. In one embodiment up to 30% of the first connection layer on the backside area of the component or BSM layer is removed. Alternatively, up to 10% of the first connection layer on the backside area of the component or BSM layer is removed. A first connection layer free second region (e.g., peripheral region) is formed over the BSM layer.

Figure 5:
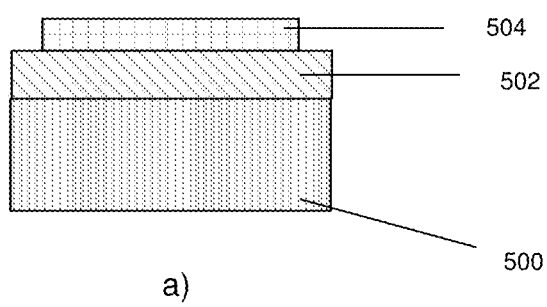
FIGS. 5a and 5b show an embodiment of a cross-sectional view and a top view of an electric component before contacting the electric component to a component carrier.
Figure 5:
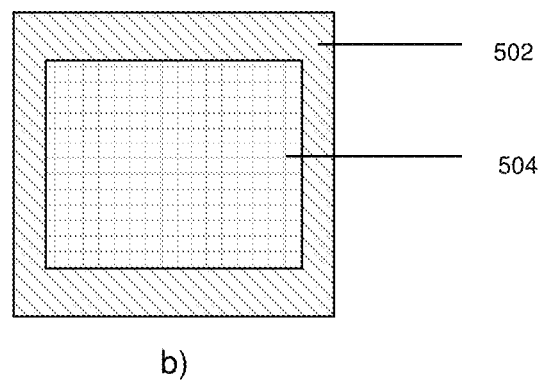

FIGS. 5a and 5b show a cross-sectional view and a top view of an embodiment of a backside layer arrangement for a single component. The BSM layer 502 covers the entire backside area of the component 500 while the first connection layer 504 only covers a central region of the backside area of the component 500. The first connection layer 504 is removed in the peripheral region of the backside area of the component 500.

In one embodiment the first connection layer may be partially or area selectively removed by laser ablation. The first connection layer may be removed by using Nd:YAG and excimer lasers which produce UV light of 193 or 248 nm wavelength. Area-selective first connection layer (e.g., solder) removal may be achieved by highly focused laser beams, or by optical shielding of the rim region. Annealing of the component backside stack during laser ablation may assist the evaporation of solder materials and minimize undesired first connection layer (e.g., solder) re-deposition in the edge regions which should remain first connection layer (e.g., solder)-free.

In one embodiment the first connection layer may be partially removed by a wet or dry etch procedure. The etch procedure allows to pattern the borderline between first connection layer (e.g., solder)-covered and first connection layer (e.g., solder)-free regions with high alignment accuracy and with high profile quality. Lithography-based patterning processes and subsequent etch processes are ideally suited to structure a plurality of solder patterns with solder-free rim regions.

Figure 6:
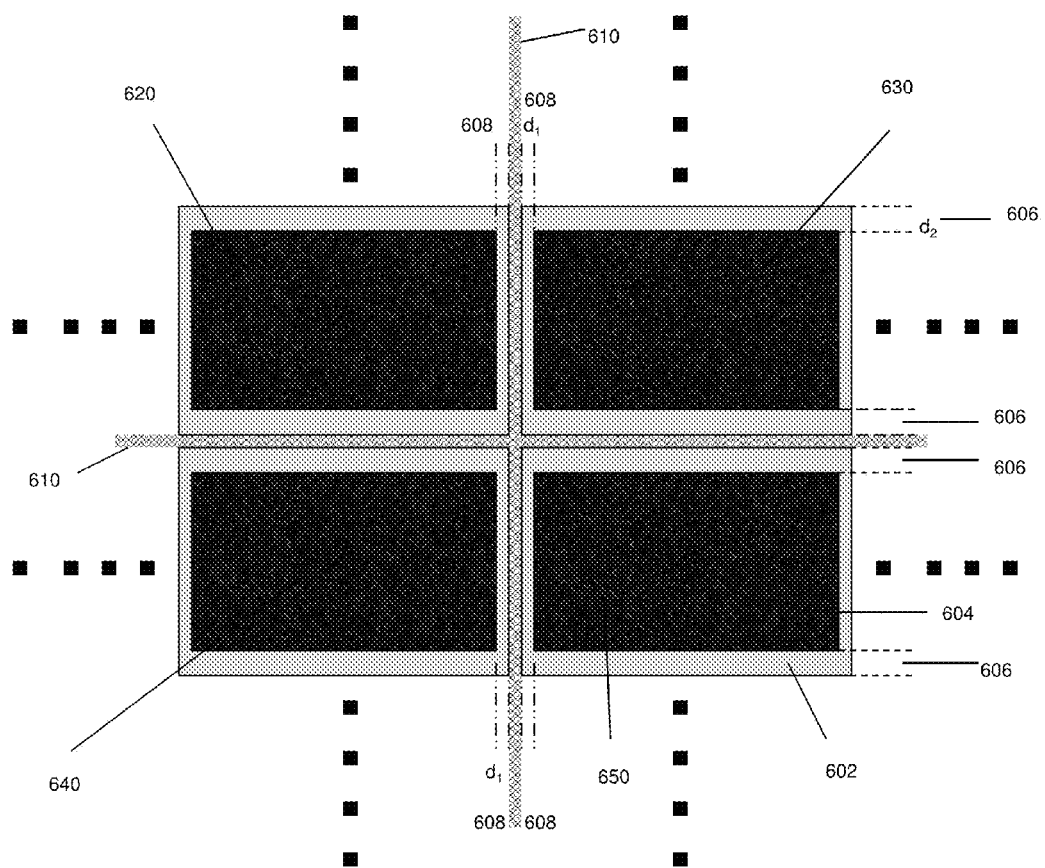
FIG. 6 shows a detailed top view of an embodiment of a wafer comprising electric component backsides.

FIG. 6 illustrates a detailed top view of an embodiment of a backside of a carrier (e.g., wafer) comprising four adjacent rectangular components. These four components 620-650 are part of a plurality of components extending over the whole carrier (e.g., wafer). The backside of the carrier (e.g., wafer) is covered with the BSM layer. The area of the BSM layer which remains covered with the first connection layer (e.g., solder) 604 is surrounded by a first connection layer (e.g., solder)-free region 602 wherein the width of the region 602 is $d_1$ 608 in x-direction and $d_2$ 606 in the y-direction. Width $d_1$ and width $d_2$ may be the same or may be different.

The cross-like bars separating the individual components 620-640 correspond to the area of the carrier (e.g., wafer) which will be lost during dicing. The width of the dicing bar 610 is marked as $d_{dice}$. Consequently, the patterning distance between adjacent solder-covered regions may be $2d_1+d_{dice}$ in x-direction, and $2d_2+d_{dice}$ in y-direction.

The first connection layer is removed over the peripheral regions by a wet or dry etch (after patterning a photoresist). In a wet etch the solder material is removed with an aqueous solution of HCl/HF (1:1) or HCl/HNO$_3$ (1:1), for example. The wet etch process is isotropic in nature. In a dry etch the solder is removed by a RIE, for example. Etch gases for metals may contain fluorine-containing compounds such as $CF_4$, $CHF_3$, $CH_2F_2$, $C_4F_8$, $C_4F_6$, $SiF_4$, or $SF_6$, or chlorine containing compounds (such as Cl2, $CCl_4$, HCl), often with additions of $N_2$, noble gases (He, Ar) or $O_2$. Mixtures of fluorine and chlorine containing gases with $O_2$ addition may work successfully for many solder removal processes. After completion of the wet or dry etch process the photoresist is removed.

In one embodiment the first connection (e.g. solder) layer is selectively formed on the BSM layer so that the first connection layer only covers the central region of the backside area of the components but not the peripheral region of this backside area. The first connection layer may be formed by selective depositing solder via mechanical rim shielding, spraying/sprinkling of solder, or stencil printing of a solder paste.

Next at 425, a second connection layer (e.g., buffer layer such as polymer layer) is formed in the region where the first connection layer was removed. The second connection layer may be deposited over the first connection layer and the exposed BSM layer. Alternatively, the second connection layer may be selectively disposed over the exposed BSM layer. The second connection layer may fill the region where the first connection layer was removed. The second connection layer may be directly formed on the BSM layer. The second connection layer may be formed by spin coating, dispensing solutions of organic materials or printing materials. Evaporation of solvents may occur in a post-apply bake. Undesired material of the second connection layer is removed by chemical mechanical polishing (CMP), or other methods such as grinding/polishing.

In one embodiment the second connection layer material may be squeezed in the areas where the first connection layer was removed. Alternatively, the second connection layer is disposed adjacent the selectively disposed first connection layer. Excess material of the second connection layer protruding from the component periphery may be removed via like laser ablation.

In an optional step 430, the second connection layer or buffer layer (e.g., polymer material connection layer) is pre-cured in order to make it easier to handle the carrier (e.g., wafer) such as dicing the carrier and transportation the carrier. Pre-curing may be carried out at temperatures between about 80° C. and about 200° C.

In step 435 the carrier is diced forming a plurality of individual components each having a backside hybrid connection layer arrangement comprising the first connection layer and the second connection layer. Then, at 440, the individual components are flipped and assembled on a component carrier. In particular, the individual component is placed on a component attach area of the component carrier.

In one embodiment the component may be attached to the component carrier via diffusion bonding. For example, the hybrid connection layer contact surface on the component backside is brought into physical contact with a component carrier (e.g., leadframe) surface. In order to create intermetallic grain growth along the contact surface between the first connection (e.g., solder) material and the component carrier (e.g., leadframe) metal (e.g., Cu) the temperature may be set to about 20° C. to about 50° C. above the melting point of the first connection (e.g., solder) material. The bonding temperature can be lowered when using eutectic first connection (e.g., solder) materials. For example, the eutectic temperature for eutectic alloys is about 231° C. for Au/Sn, about 370° C. for Au/Si, or about 156° C. for Au/In. Bonding may be carried out in reducing atmosphere (4% $H_2$ in $N_2$). Temperatures in the range of about 300° C. to about 400° C. may be suffice to form strong chemical bonds between the component carrier (e.g., leadframe) surface and the buffer (e.g., polymer) layer (e.g., via metal-O—C ore metal-O—Si bonds).

Alternatively the component may be attached via reactive bonding. After bringing the hybrid connection layer at the component backside in physical contact to the component carrier, a self-propagating exothermic reaction within the BSM layer may be initiated from the periphery of the multilayer reactive bonding stack, which leads to a spreading of heat creation over the whole contact area inducing the melting of the overlying solder layer. For example, self-propagating exothermic reaction may be initiated with an energy pulse by heat, pressure, or a laser pulse.

In step 445 the component is bonded to the component carrier. For example, component contact pads of the top surface of the component are bonded to carrier contact pads of the component carrier. The component contact pads of the component are wire bonded, ball bonded or otherwise bonded to the carrier contact pads. The wires are a metal such as aluminum (Al), copper (Cu), silver (Ag) or gold (Au).

At step 450, the component is encapsulated with a molding compound. The molding compound may comprise a thermoset material or a thermoplastic material. The molding compound may comprise a coarse grained material. In one embodiment transfer molding may be applied to encapsulate the component/carrier unit(s). The molding material such as a thermosetting molding material is under pressure transferred into the molding chamber and fills the mold cavities. A post-cure step may follow.

Alternatively, injection molding may be utilized. For example, plastic pellets may pass through several heating zones until they exit from the final heat zone into a molten state. From there the molding material is injected into the molding chamber where solidification occurs. Injection molding can be applied to both thermoplastic and thermosetting plastic materials. Irrespective of the molding method applied, the resulting packages are subsequently subjected to a de-flashing operation to remove excessive resin. De-flashing is performed utilizing mixtures of fine abrasive particles in combination with high pressure air or a high pressure water slurry.

Finally at 455 the encapsulated component carrier is diced into packaged electric components each comprising a component. For example, the individual packaged electric components are singulated using a dicing saw.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing an electrical device, the method comprising:
   forming a backside metallization (BSM) layer over a backside of a carrier;
   forming a conductive connection layer over the BSM layer, the conductive connection layer being disposed on a center region of a component of a plurality of components supported by the carrier;
   forming a polymer material connection layer over the BSM layer in a periphery region of the component;
   singulating the component from the carrier;
   electrically bonding the component to a component carrier; and
   encapsulating the component and a portion of the component carrier.

2. The method according to claim 1, wherein the polymer material connection layer comprises conductive filler particles.

3. The method according to claim 1, wherein the polymer material connection layer is pre-cured.

4. The method according to claim 1, wherein bonding the component to the component carrier comprises curing the polymer material connection layer.

5. The method according to claim 1, wherein forming the conductive connection layer comprises forming the conductive connection layer over the backside of the carrier and removing a portion of the conductive connection layer.

6. The method according to claim 1, wherein encapsulating the component and the portion of the component carrier comprises molding the component and the portion of the component carrier.

7. The method according to claim 1, wherein encapsulating the component and the portion of the component carrier comprises laminating the component and the portion of the component carrier.

8. A method of manufacturing an electrical device, the method comprising:
   forming a first conductive connection layer over a wafer, the first conductive connection layer being disposed only on a center region of each individual chip of a plurality of chips supported by the wafer; and
   forming a second conductive connection layer over the wafer, the second conductive connection layer disposed over a peripheral region and lateral adjacent to the center region of each individual chip,
   wherein the first conductive connection layer comprises a metal, and wherein the second conductive connection layer comprises a polymer material with conductive filler particles.

9. The method according to claim 8, wherein the metal comprises a solder material.

10. The method according to claim 8, wherein the polymer comprises a highly cross-linked epoxide or a highly cross-linked acrylate resin.

11. The method according to claim 8, wherein the polymer comprises a thermoplastic.

12. The method according to claim 8, wherein the polymer comprises a material with a short term thermal stability of up to 400° C.

13. The method according to claim 8, wherein the center region comprises about 70% to 90% of each individual chip main surface, and wherein the peripheral region comprises about 10% to 30% of each individual chip main surface.

14. The method according to claim 8, further comprising singulating each individual chip from the wafer.

15. The method according to claim 8, wherein forming the first conductive connection layer over the wafer comprises forming a continuous and non-perforated first conductive connection layer over the wafer.

16. A method of manufacturing an electrical device, the method comprising:
   forming a first conductive connection layer over a wafer, the first conductive connection layer being disposed only on a center region of each individual chip of a plurality of chips supported by the wafer, wherein the first conductive connection layer comprise a first elastic coefficient value; and
   forming a second conductive connection layer over the wafer, the second conductive connection layer disposed over a peripheral region and lateral adjacent to the center region of each individual chip, wherein the second conductive connection layer comprises a second elastic coefficient value, and wherein the second elastic coefficient value is significant higher than the first elastic coefficient value.

17. The method according to claim 16, wherein the second elastic coefficient value is between 100 MPa and 10 GPa.

18. The method according to claim 16, wherein the center region comprises about 70% to 90% of each individual chip main surface, and wherein the peripheral region comprises about 10% to 30% of each individual chip main surface.

19. The method according to claim 16, further comprising singulating each individual chip from the wafer.

20. The method according to claim 16, wherein forming the first conductive connection layer comprises forming the first conductive connection layer over the wafer and removing a portion of the first conductive connection layer over the peripheral region of each individual chip.

21. The method according to claim 20, wherein removing the portion of the first conductive connection layer over the peripheral region of each individual chip comprises removing the portion with laser light.

* * * * *